(12) United States Patent
Park (10) Patent No.: US 11,784,258 B2
(45) Date of Patent: Oct. 10, 2023

(54) THIN FILM TRANSISTOR WITH INSULATING PORTION BETWEEN SOURCE/DRIAN ELECTRODE AND GATE INSULATING LAYER, AND MANUFACTURING METHOD THEREOF

(71) Applicants: BOE Technology Group Co., Ltd., Beijing (CN); Hefei Boe Optoelectronics Technology Co., Ltd., Anhui (CN)

(72) Inventor: Kuhyun Park, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 391 days.

(21) Appl. No.: 16/309,786

(22) PCT Filed: Apr. 4, 2018

(86) PCT No.: PCT/CN2018/081832
§ 371 (c)(1),
(2) Date: Dec. 13, 2018

(87) PCT Pub. No.: WO2019/001066
PCT Pub. Date: Jan. 3, 2019

(65) Prior Publication Data
US 2020/0335631 A1 Oct. 22, 2020

(30) Foreign Application Priority Data
Jun. 27, 2017 (CN) .......................... 201710500420.X (51) Int. Cl.
*H01L 29/786* (2006.01)
*H01L 29/417* (2006.01)
*H01L 29/66* (2006.01)

(52) U.S. Cl.
CPC .. *H01L 29/78618* (2013.01); *H01L 29/41733* (2013.01); *H01L 29/66742* (2013.01); *H01L 29/7869* (2013.01); *H01L 29/78606* (2013.01)

(58) Field of Classification Search
CPC .................................................. H01L 29/41733
See application file for complete search history.

(56) References Cited

U.S. PATENT DOCUMENTS 5,286,659 A 2/1994 Mitani et al.
6,649,933 B2 * 11/2003 Wong ................ H01L 29/41733
257/347

(Continued)

FOREIGN PATENT DOCUMENTS

CN 102157562 A 8/2011
CN 104064601 A 9/2014

(Continued)

OTHER PUBLICATIONS

International Search Report and Written Opinion of the International Searching Authority (with English translation of Written Opinion), International Application No. PCT/CN2018/081832, dated Jul. 9, 2018, 13 pp.

(Continued)

*Primary Examiner* — Daniel Luke
(74) *Attorney, Agent, or Firm* — Myers Bigel, P.A.

(57) ABSTRACT

A thin film transistor, a manufacturing method thereof, an array substrate, and a display device are provided. The thin film transistor comprises a base substrate, a gate on the base substrate, a gate insulating layer covering the gate, an active layer on the gate insulating layer, a first electrode and a (Continued)

second electrode over and electrically connected to the active layer, and a first insulating portion between the gate insulating layer and the first electrode. An orthographic projection of the first insulating portion on the base substrate, an orthographic projection of the first electrode on the base substrate, and an orthographic projection of a boundary between a side surface of the gate and an upper surface of the gate on the base substrate at least partially overlap.

10 Claims, 10 Drawing Sheets

(56) References Cited

U.S. PATENT DOCUMENTS

| | | | | |
|---|---|---|---|---|
| 8,436,353 | B2* | 5/2013 | Moriguchi | H01L 29/78609 257/57 |
| 8,450,733 | B2* | 5/2013 | Wang | H01L 27/1225 257/43 |
| 9,117,917 | B2* | 8/2015 | Lee | H01L 29/7869 |
| 9,190,526 | B2* | 11/2015 | Moriguchi | H01L 29/7869 |
| 9,281,350 | B2* | 3/2016 | Lee | H01L 29/78606 |
| 9,450,103 | B2* | 9/2016 | Chung | H01L 29/66969 |
| 9,478,612 | B2* | 10/2016 | Kim | H01L 29/41733 |
| 9,502,577 | B2* | 11/2016 | Wang | H01L 29/78606 |
| 9,553,109 | B2* | 1/2017 | Konomi | G02F 1/136227 |
| 10,199,507 | B2* | 2/2019 | Jeon | H01L 29/78633 |
| 2004/0197966 | A1 | 10/2004 | Cho et al. | |
| 2012/0223315 | A1* | 9/2012 | Uemura | H01L 29/78669 257/72 |
| 2015/0028300 | A1* | 1/2015 | Kim | H01L 29/7869 257/40 |
| 2017/0229571 | A1 | 8/2017 | Choi et al. | |

FOREIGN PATENT DOCUMENTS

| | | |
|---|---|---|
| CN | 105047611 A | 11/2015 |
| CN | 105161519 A | 12/2015 |
| CN | 107146818 A | 9/2017 |
| EP | 0493113 A2 | 7/1992 |
| KR | 10-2014-0042573 A | 4/2014 |

OTHER PUBLICATIONS

First Office Action with English language translation, CN Patent Application No. 201710500420.X, dated Jun. 3, 2019, 20 pp.
Second Review Notice with English language translation, CN Patent Application No. 201710500420.X, dated Jun. 3, 2019, 12 pp.

* cited by examiner

THIN FILM TRANSISTOR WITH INSULATING PORTION BETWEEN SOURCE/DRIAN ELECTRODE AND GATE INSULATING LAYER, AND MANUFACTURING METHOD THEREOF

CROSS REFERENCE TO RELATED APPLICATIONS

The present application is a 35 U.S.C. 371 national stage application of PCT International Application No. PCT/CN2018/081832, filed on Apr. 4, 2018, which claims the benefit of Chinese Patent Application No. 201710500420.X, filed on Jun. 27, 2017, the contents of which are incorporated herein by reference in their entireties.

FIELD

The present disclosure relates to the field of semiconductor technologies, and particularly to a thin film transistor, a manufacturing method thereof, an array substrate and a display device.

BACKGROUND

With the continuous development of display technologies, increasingly high requirements have been posed on the pixel aperture ratio of display products. Active layers of current thin film transistors mostly use an oxide semiconductor material, and price of the oxide semiconductor material is lower.

SUMMARY

In an aspect of the present disclosure, there is provided a thin film transistor comprising a base substrate, a gate on the base substrate, a gate insulating layer covering the gate, an active layer on the gate insulating layer, a first electrode and a second electrode over the active layer and electrically connected to the active layer, and a first insulating portion between the gate insulating layer and the first electrode. The following orthographic projections at least partially overlap: an orthographic projection of the first insulating portion on the base substrate, an orthographic projection of the first electrode on the base substrate, and an orthographic projection of a boundary between a side surface of the gate and an upper surface of the gate on the base substrate.

In some embodiments, the active layer comprises a first groove, and the first insulating portion is filled in the first groove.

In some embodiments, the first insulating portion is located between the first electrode and the active layer.

In some embodiments, the thin film transistor further comprises a second insulating portion between the gate insulating layer and the second electrode. The following orthographic projections at least partially overlap: an orthographic projection of the second insulating portion on the base substrate, an orthographic projection of the second electrode on the base substrate, and the orthographic projection of the boundary between the side surface of the gate and the upper surface of the gate on the base substrate.

In some embodiments, the active layer comprises a second groove, and the second insulating portion is filled in the second groove.

In some embodiments, the second insulating portion is located between the second electrode and the active layer.

In some embodiments, the first groove is a through hole penetrating the active layer.

In some embodiments, the second groove is a through hole penetrating the active layer.

In some embodiments, the first insulating portion is located between the active layer and the gate insulating layer.

In some embodiments, the second insulating portion is located between the active layer and the gate insulating layer.

In some embodiments, the thin film transistor further comprises an etch barrier layer over the active layer and between the first electrode and the second electrode.

In some embodiments, a material of the first insulating portion is the same as that of the etch barrier layer.

In some embodiments, a material of the second insulating portion is the same as that of the etch barrier layer.

In another aspect of the present disclosure, there is provided an array substrate comprising any of the thin film transistors described above.

In a further aspect of the present disclosure, there is provided a display device comprising the array substrate described above.

In yet another aspect of the present disclosure, there is provided a manufacturing method of a thin film transistor, comprising: forming a pattern of a gate on a base substrate; forming a gate insulating layer on the gate; forming a pattern of an active layer on the gate insulating layer; forming, on the active layer, patterns of a first electrode and a second electrode electrically connected to the active layer. After forming the gate insulating layer and before forming the patterns of the first electrode and the second electrode, the manufacturing method further comprises forming a pattern of a first insulating portion. The following orthographic projections at least partially overlap: an orthographic projection of the first insulating portion on the base substrate, an orthographic projection of the first electrode on the base substrate, and an orthographic projection of a boundary between a side surface of the gate and an upper surface of the gate on the base substrate.

In some embodiments, after forming the pattern of the active layer and before forming the patterns of the first electrode and the second electrode, the manufacturing method further comprises forming a pattern of a second insulating portion, wherein the following orthographic projections at least partially overlap: an orthographic projection of the second insulating portion on the base substrate, an orthographic projection of the second electrode on the base substrate, and the orthographic projection of the boundary between the side surface of the gate and the upper surface of the gate on the base substrate.

In some embodiments, after forming the pattern of the active layer and before forming the first electrode and the second electrode, the manufacturing method further comprises forming a pattern of an etch barrier layer.

In some embodiments, said forming a pattern of a first insulating portion and a pattern of a second insulating portion includes: forming a first groove and a second groove in the active layer; forming the pattern of the first insulating portion in the first groove while forming the pattern of the etch barrier layer; and forming the pattern of the second insulating portion in the second groove while forming the pattern of the etch barrier layer.

In some embodiments, the first insulating portion, the second insulating portion, and the etch barrier layer are formed by a same patterning process.

In some embodiments, after forming the patterns of the first electrode and the second electrode, the manufacturing method further comprises forming a passivation layer on the first electrode and the second electrode.

DETAILED DESCRIPTION

Implementations of a thin film transistor, a manufacturing method thereof and a display device provided by embodiments of the present disclosure will be described in detail below with reference to the accompanying drawings.

Sizes and shapes of various components in the drawings are not shown true to scale, and are merely intended to illustrate the disclosure.

Figure 1:
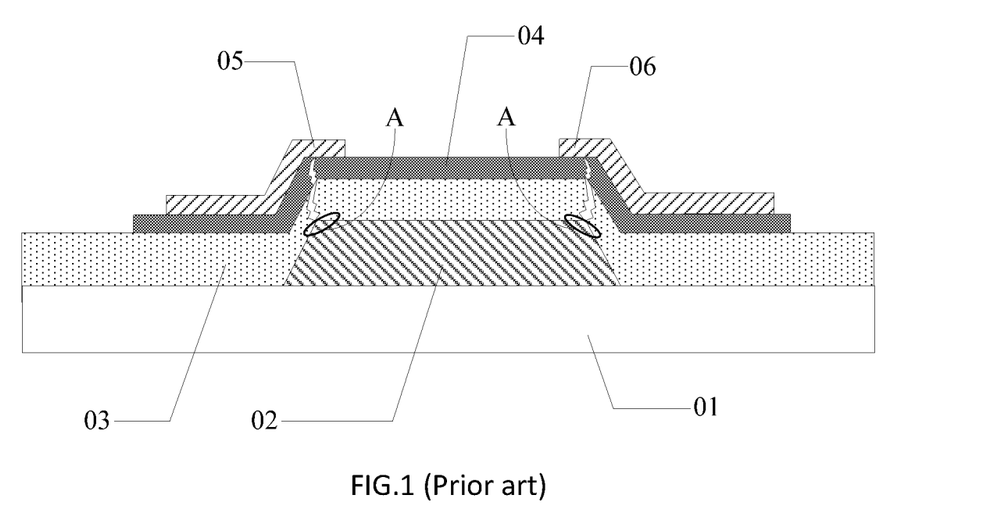
FIG. 1 is a schematic structural view of a typical thin film transistor.

FIG. 1 illustrates a structure of a typical oxide semiconductor TFT. As shown in FIG. 1, the oxide semiconductor TFT comprises a base substrate 01, a gate 02 on the base substrate 01, a gate insulating layer 03 covering the gate 02, an active layer 04 on the gate insulating layer 03, and a first electrode 05 and a second electrode 06 electrically connected to the active layer 04. As shown in FIG. 1, the first electrode 05, the second electrode 06, and the active layer 04 each have an overlapping region with the gate 02. In this case, since the gate 02 of the TFT has a certain thickness, when the gate insulating layer 03 and the active layer 04 are formed over the gate 02, the active layer 04 is prone to breakage in a region corresponding to a boundary A between a side surface of the gate 02 and an upper surface thereof. On the other hand, electrostatic accumulation easily occurs at the boundary A between the side surface of the gate 02 and the upper surface thereof, so that the gate insulating layer 03 is broken down, and further a short circuit occurs between the gate 02 of the TFT and the first electrode 05 or the second electrode 06, resulting in a failure in the TFT.

Figure 2A:
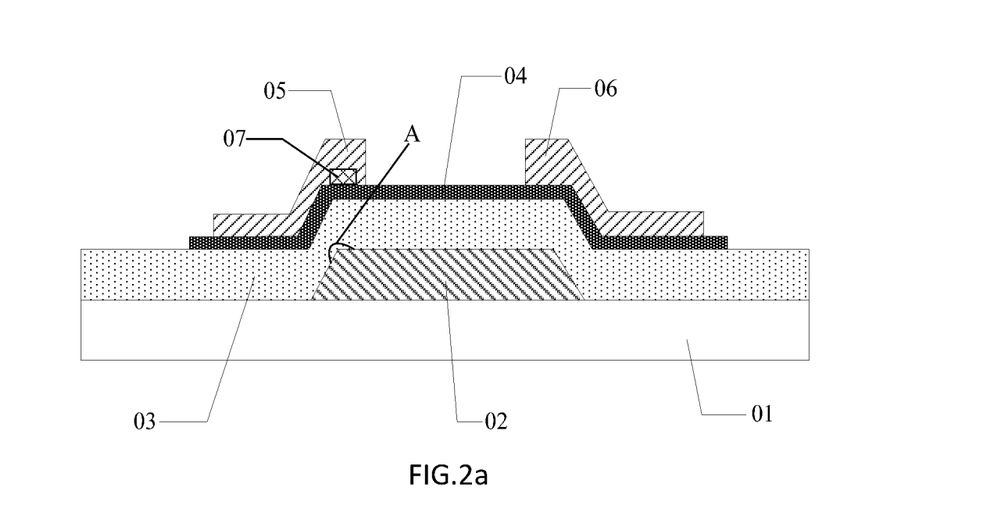
FIG. 2a is a schematic sectional view of a thin film transistor provided an embodiment of the present disclosure.

In view of this, an embodiment of the present disclosure provides a thin film transistor, as shown in FIG. 2a, comprising: a base substrate 01, a gate 02 on the base substrate, a gate insulating layer 03 covering the gate 02, an active layer 04 on the gate insulating layer 03, and a first electrode 05 and a second electrode 06 which are over and electrically connected to the active layer 04. Further, the thin film transistor further comprises a first insulating portion 07 between the gate insulating layer 03 and the first electrode 05.

As shown in FIG. 2a, an orthographic projection of the first insulating portion 07 on the base substrate 01, an orthographic projection of the first electrode 05 on the base substrate 01, and an orthographic projection of the boundary A between the side surface of the gate 02 and the upper surface thereof on the base substrate 01 at least partially overlap.

In the above-described thin film transistor provided by an embodiment of the present disclosure, the first insulating portion is disposed in the first electrode, wherein the orthographic projection of the first insulating portion on the base substrate, the orthographic projection of the first electrode on the base substrate, and the orthographic projection of the boundary between the side surface of the gate and the upper surface thereof on the base substrate at least partially overlap. In a typical thin film transistor, on the one hand, electrostatic accumulation easily occurs at the boundary between the side surface of the gate and the upper surface thereof, which causes a breakdown of the gate insulating layer, and on the other hand, the active layer is prone to breakage in a region corresponding to the boundary between the side surface of the gate and the upper surface thereof (for example, due to the large thickness of the gate 02 or the presence of impurities), so that a short circuit is likely to occur between the gate of the TFT and the first electrode at the position where electrostatic accumulation or breakage occurs. In view of this, the present disclosure proposes to arrange a first insulating portion between the gate insulating layer and the first electrode in the active layer region which is prone to breakage and the gate insulating layer region where electrostatic accumulation easily occurs. In this way, even if the gate insulating layer and the active layer are broken in a region corresponding to the boundary between the side surface of the gate and the upper surface thereof, a short circuit will not occur between the gate and the first electrode, thereby avoiding a failure in the TFT.

It is to be noted that the boundary between the side surface of the gate and the upper surface thereof may be a point or a line, which is not limited herein.

In an exemplary embodiment, in the above-described thin film transistor provided by an embodiment of the present disclosure, the first electrode may be a source and the second electrode is a drain. Alternatively, the first electrode may be a drain and the second electrode is a source, which is not limited herein.

Figure 3A:
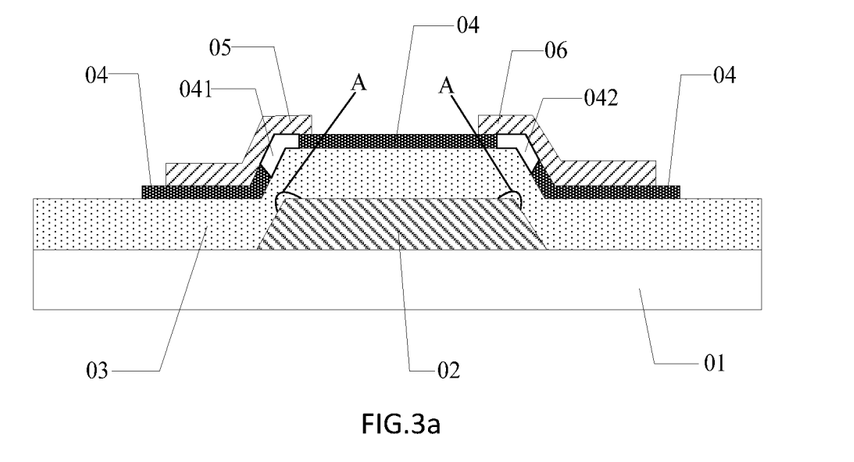
FIG. 3a is a schematic sectional view of a thin film transistor provided by another embodiment of the present disclosure.
Figure 3B:
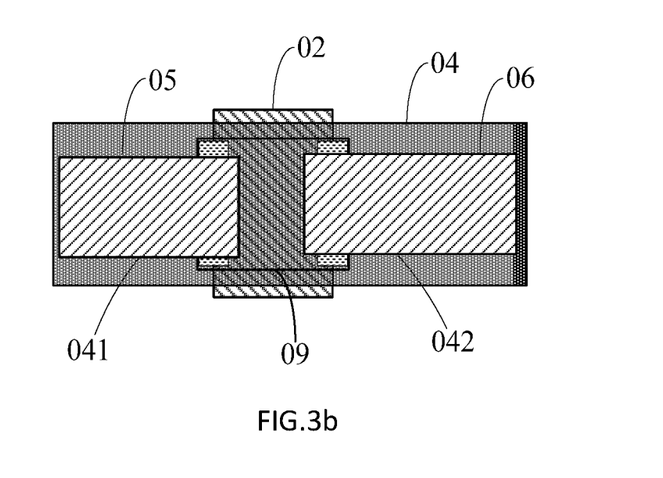
FIG. 3b is a schematic top view of a thin film transistor provided by an embodiment of the present disclosure.
Figure 3C:
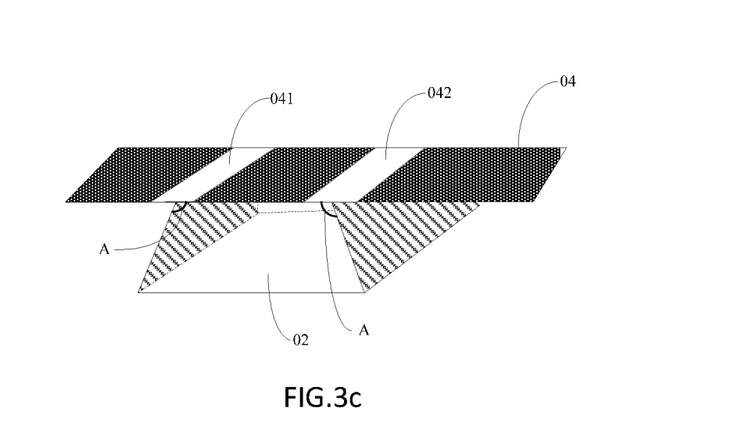
FIG. 3c is a schematic perspective view showing a positional relationship between an active layer and a gate in a thin film transistor provided by an embodiment of the present disclosure.

The first insulating portion 07 may be disposed at any position between the gate insulating layer 03 and the first electrode 05. For example, as shown in FIG. 2a, the first insulating portion 07 is between the first electrode 05 and the active layer 04. Alternatively, as shown in FIGS. 3a to 3c, a first groove 041 is disposed in the active layer 04, and the first insulating portion 07 is filled in the first groove 041.

Of course, upon implementation, the first insulating portion may also be located between the gate insulating layer and the active layer, which is not limited herein.

Figure 2B:
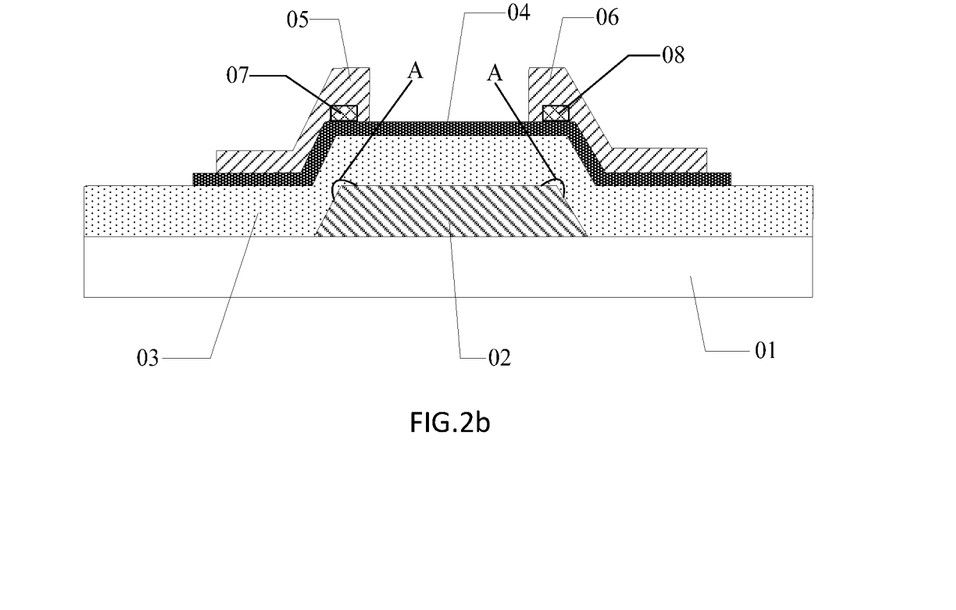
FIG. 2b is a schematic sectional view of a thin film transistor provided by another embodiment of the present disclosure.
Figure 2C:
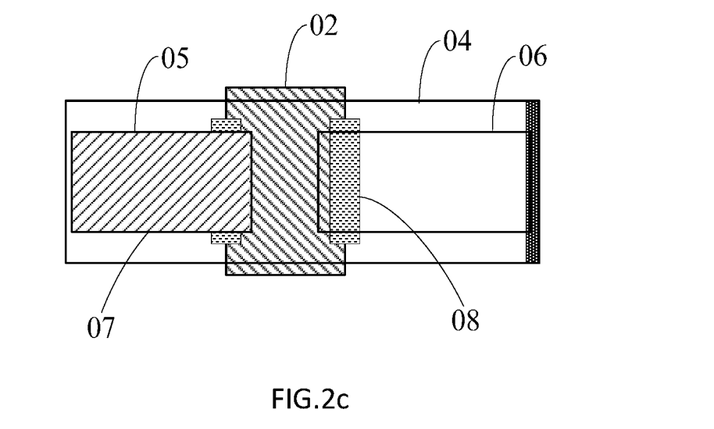
FIG. 2c is a schematic top view of a thin film transistor provided by an embodiment of the present disclosure.
Figure 2D:
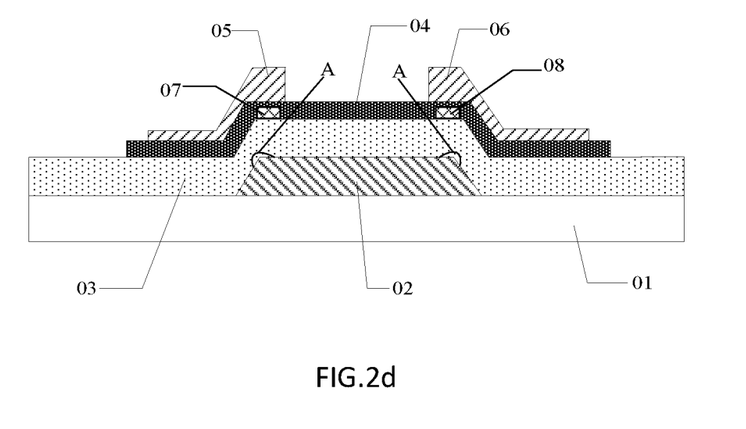
FIG. 2d is a schematic sectional view of a thin film transistor provided by still another embodiment of the present disclosure.

In order to further prevent occurrence of a short circuit between the gate and the first electrode or the second electrode caused by the breakage of the gate insulating layer and the active layer in a region corresponding to the boundary between the side surface of the gate and the upper surface thereof, the thin film transistor provided by an embodiment of the present disclosure further comprises, as shown in FIGS. 2b and 2c, a second insulating portion 08 between the gate insulating layer 03 and the second electrode 06.

In particular, an orthographic projection of the second insulating portion 08 on the base substrate 01, an orthographic projection of the second electrode 06 on the base substrate 01, and an orthographic projection of the boundary A between the side surface of the gate 02 and the upper surface thereof on the base substrate 01 at least partially overlap.

Similar to the first insulating portion 07, the second insulating portion 08 may be disposed at any position between the gate insulating layer 03 and the second electrode 06. For example, as shown in FIGS. 2b and 2c, the second insulating portion 08 is between the second electrode 06 and the active layer 04. Alternatively, as shown in FIGS. 3a to 3c, a second groove 042 is disposed in the active layer 04, and the second insulating portion 08 is filled in the second groove 042.

Of course, upon implementation, the second insulating portion may also be located between the gate insulating layer and the active layer, which is not limited herein.

Upon implementation, sizes of the first insulating portion and the second insulating portion may be set according to actual conditions. For example, the sizes of the first insulating portion and the second insulating portion may be determined according to area of a region where a short circuit is likely to occur between the gate and the first electrode or the second electrode. In general, the first insulating portion or the second insulating portion at least needs to cover the region where a short circuit is likely to occur.

In an exemplary embodiment, in order to better prevent a short circuit from occurring between the gate and the first electrode or the second electrode, in the above-described thin film transistor provided by an embodiment of the present disclosure, the first groove and the second groove may both be through holes penetrating the active layer, that is, the first groove and the second groove may each penetrate from the upper surface of the active layer to a lower surface thereof.

Figure 5A:
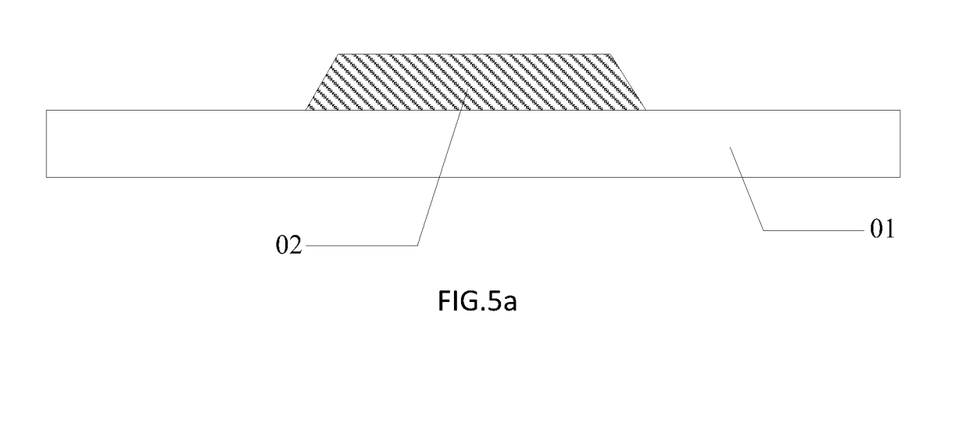
FIGS. 5a to 5f are schematic structural views after each step of a manufacturing method of a thin film transistor as provided by an embodiment of the present disclosure is performed, respectively.
Figure 5B:
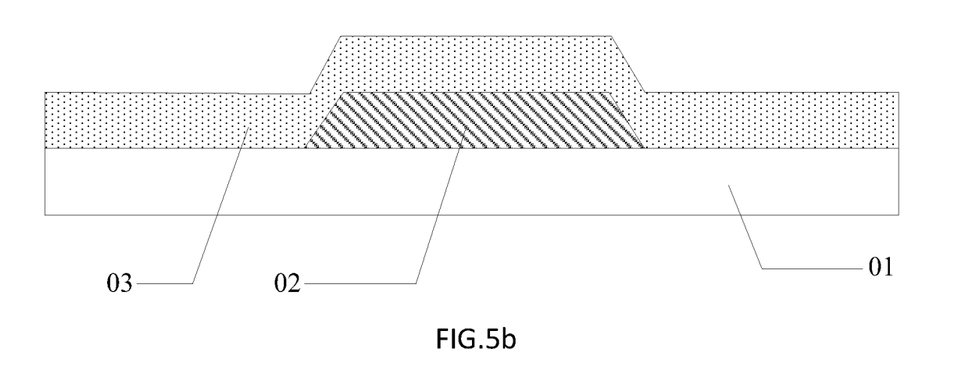
Figure 5C:
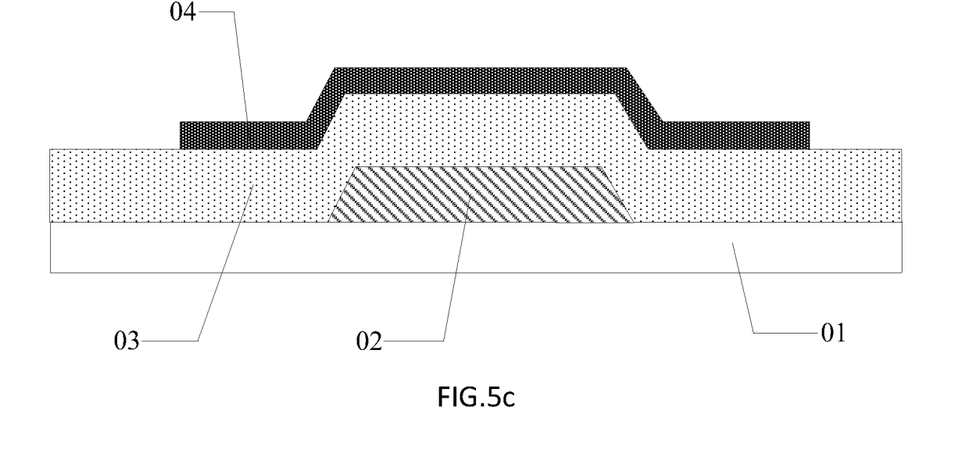
Figure 5D:
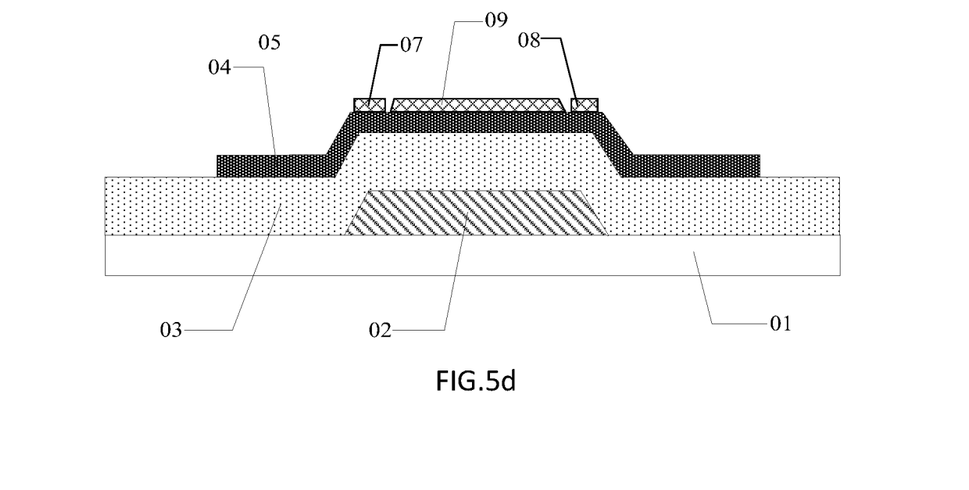
Figure 5E:
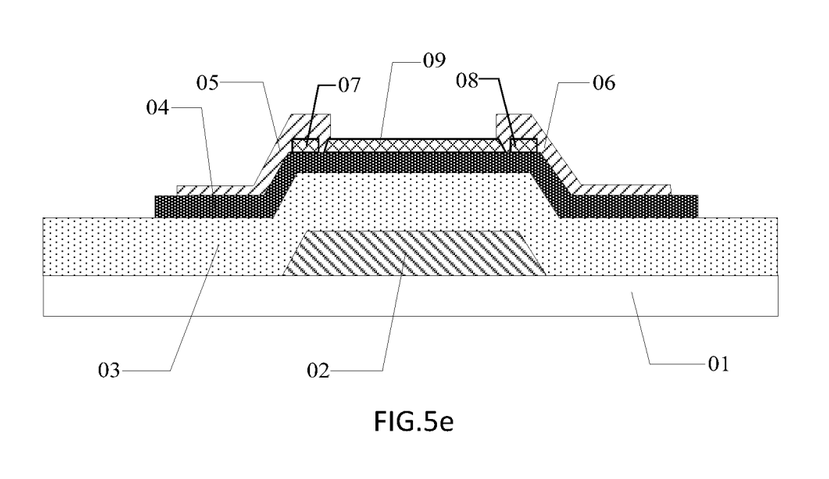
Figure 5F:
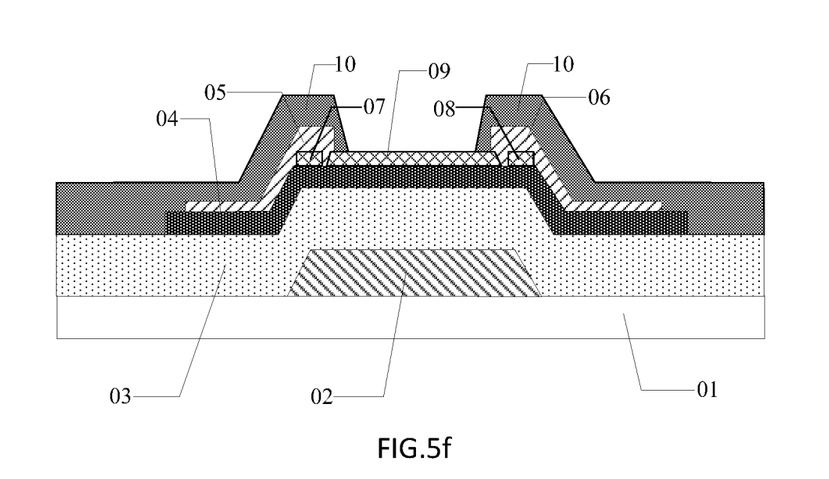

Upon implementation, since an etching process is usually required at the time of forming the patterns of the first electrode and the second electrode, in order to prevent a surface of the active layer from being damaged during etching, the above-described thin film transistor provided by an embodiment of the present disclosure may further comprise, as shown in FIGS. 3b and 5f, an etch barrier layer 09 over the active layer 04 and between the first electrode 05 and the second electrode 06.

In an exemplary embodiment, in the above-described thin film transistor provided by an embodiment of the present disclosure, a material of the first insulating portion 07 may be the same as that of the etch barrier layer 09. Thus, the first groove 041 may be filled while the etch barrier layer 09 is being formed so as to form the first insulating portion 07 without separately performing a process for filling the first groove 041, thereby simplifying the manufacturing process and reducing the manufacturing cost.

In an exemplary embodiment, in the above-described thin film transistor provided by an embodiment of the present disclosure, when the thin film transistor comprises the second insulating portion 08, a material of the second insulating portion 08 may be the same as that of the etch barrier layer 09. Thus, the second groove 042 may be filled while the etch barrier layer 09 is being formed so as to form the second insulating portion 08 without separately performing a process for filling the second groove 042, thereby simplifying the manufacturing process and reducing the manufacturing cost.

In an exemplary embodiment, in the above-described thin film transistor provided by an embodiment of the present disclosure, the material of the etch barrier layer may be silicon nitride, silicon oxide, titanium oxide or aluminum oxide, etc., which is not limited herein.

In an exemplary embodiment, in order to prevent the first electrode and the second electrode from being invaded by foreign materials so as to further ensure the performance of the thin film transistor, the above-described thin film transistor provided by an embodiment of the present disclosure may further comprise, as shown in FIG. 5f, a passivation layer 10 covering the electrode 05 and the second electrode 06.

In an exemplary embodiment, in the above-described thin film transistor provided by an embodiment of the present disclosure, a material of the passivation layer may be silicon nitride, silicon oxide, titanium oxide or aluminum oxide, etc., which is not limited herein.

In an exemplary embodiment, in the above-described thin film transistor provided by an embodiment of the present disclosure, a material of the active layer may be an oxide semiconductor material.

It is to be noted that all other essential components of the thin film transistor are comprehensible to those ordinarily skilled in the art, which are not described herein for brevity and should not be construed as limiting the present disclosure.

Figure 4:
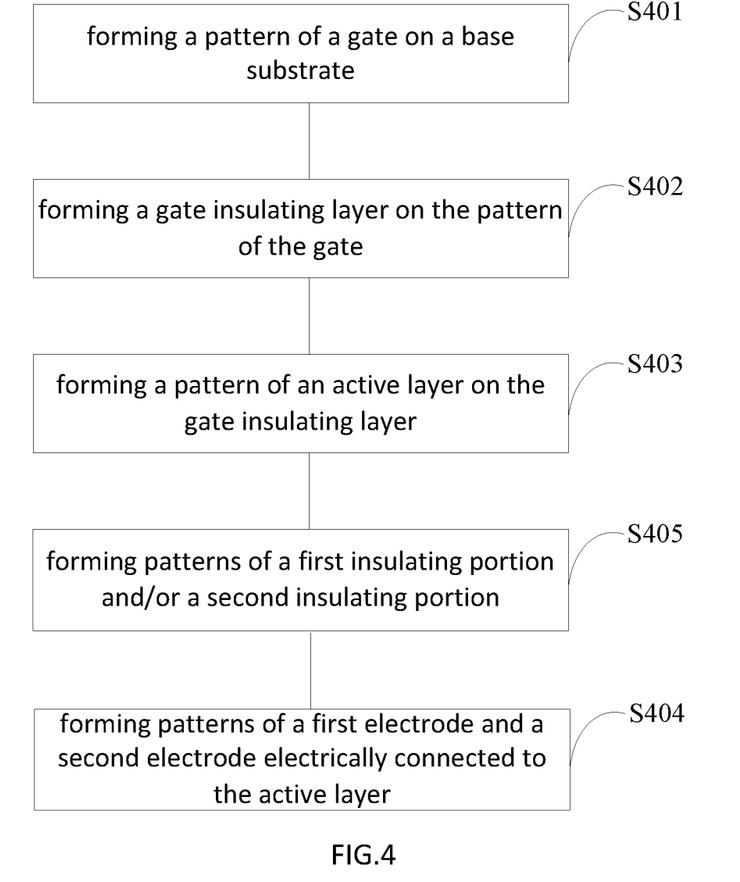
FIG. 4 is a flow chart of a method for manufacturing a thin film transistor as provided by an embodiment of the present disclosure.

An embodiment of the present disclosure further provides a manufacturing method of a thin film transistor. As shown in FIG. 4, the manufacturing method comprises, at step S401 forming a pattern of a gate on a base substrate, then at step S402 forming a gate insulating layer on the pattern of the gate, at step S403 forming a pattern of an active layer on the gate insulating layer, and at step S404 forming patterns of a first electrode and a second electrode electrically connected to the active layer.

In particular, the manufacturing method further comprises, after forming the gate insulating layer and before forming the patterns of the first electrode and the second electrode, forming patterns of a first insulating portion and/or a second insulating portion at step S405. An orthographic projection of the first insulating portion on the base substrate, an orthographic projection of the first electrode on the base substrate, and an orthographic projection of a boundary between a side surface of the gate and an upper surface thereof on the base substrate at least partially overlap. An orthographic projection of the second insulating portion on the base substrate, an orthographic projection of the second electrode on the base substrate, and the orthographic projection of the boundary between the side surface of the gate and the upper surface thereof on the base substrate at least partially overlap.

It is to be noted that although the manufacturing method of a thin film transistor according to an embodiment of the present disclosure is illustrated in a certain order in FIG. 4, the present disclosure is not limited to the illustrated order. For example, upon implementation, the pattern of the first insulating portion may be formed after the gate insulating layer is formed and before the pattern of the active layer is formed.

In the above-described manufacturing method of a thin film transistor provided by an embodiment of the present disclosure, the first insulating portion is disposed in the first electrode, wherein the orthographic projection of the first insulating portion on the base substrate, the orthographic projection of the first electrode on the base substrate, and the orthographic projection of the boundary between the side surface of the gate and the upper surface thereof on the base substrate at least partially overlap. In a typical thin film transistor, on the one hand, electrostatic accumulation easily occurs at the boundary between the side surface of the gate and the upper surface thereof, which causes a breakdown of the gate insulating layer, and on the other hand, the active layer is prone to breakage in a region corresponding to the boundary between the side surface of the gate and the upper surface thereof (for example, due to the large thickness of the gate 02 or the presence of impurities), so that a short circuit is likely to occur between the gate of the TFT and the first electrode at the position where electrostatic accumulation or breakage occurs. In view of this, the present disclosure proposes to arrange a first insulating portion between the gate insulating layer and the first electrode in the active layer region which is prone to breakage and the gate insulating layer region where electrostatic accumulation easily occurs. In this way, even if the gate insulating layer and the active layer are broken in a region corresponding to the boundary between the side surface of the gate and the upper surface thereof, a short circuit will not occur between the gate and the first electrode, thereby avoiding a failure in the TFT.

In an exemplary embodiment, the above-described manufacturing method provided by an embodiment of the present disclosure may further comprise: forming a pattern of an etch barrier layer after forming the pattern of the active layer and before forming the first electrode and the second electrode.

In an exemplary embodiment, in the above-described manufacturing method provided by an embodiment of the present disclosure, the step of forming patterns of a first insulating portion and/or a second insulating portion may include: forming a first groove and/or a second groove in the active layer; forming a pattern of the first insulating portion in the first groove while forming the pattern of the etch barrier layer; and/or forming a pattern of the second insulating portion while forming the pattern of the etch barrier layer.

In the above-described manufacturing method provided by an embodiment of the present disclosure, the pattern of the active layer may be formed on the gate insulating layer by a single patterning process.

Alternatively, an active material layer may be first formed on the gate insulating layer by a patterning process, and the first groove and the second groove are then formed in the active material layer by a patterning process, thereby finally forming the pattern of the active layer.

It is to be noted that, in the above-described manufacturing method provided by an embodiment of the present disclosure, the patterning process may include a photolithography process and an etching step, and may also include other processes for forming a predetermined pattern, such as printing, inkjet, and the like. Generally, a photolithography process refers to a process for forming a pattern using a photoresist, a mask, an exposure machine, and the like, which includes processes such as film formation, exposure, development, and the like. Upon implementation, a corresponding patterning process can be selected according to the structure formed in embodiments of the present disclosure.

In an exemplary embodiment, the above-described manufacturing method provided by an embodiment of the present disclosure may further comprise forming a passivation layer covering the first electrode and the second electrode after forming the patterns of the first electrode and the second electrode.

The manufacturing method of a thin film transistor provided by an embodiment of the present disclosure is described below through specific embodiments.

Taking a thin film transistor in which the first insulating portion is located between the first electrode and the active layer and the second insulating portion is located between the second electrode and the active layer as an example, the manufacturing method according to an embodiment of the present disclosure specifically comprises the following steps.

First, as shown in FIG. 5a, a pattern of a gate 02 is formed on a base substrate 01. Specifically, upon implementation, a gate layer may be formed on the base substrate 01 by thermal evaporation or sputtering, and then a pattern of the gate 02 is formed by a patterning process.

Next, as shown in FIG. 5b, a gate insulating layer 03 is formed on the gate 02. Specifically, upon implementation, the gate insulating layer 03 may be formed by evaporation, sputtering or spin coating, which is not limited herein.

Then, as shown in FIG. 5c, a pattern of an active layer 04 is formed on the gate insulating layer 03. Specifically, upon implementation, an active material layer may be formed on the gate insulating layer by spin coating, and then a pattern of the active layer is formed by a patterning process.

Next, as shown in FIG. 5d, patterns of a first insulating portion 07, a second insulating portion 08, and an etch barrier layer 09 are formed on the active layer 04. Specifically, upon implementation, an insulating material layer may be formed on the active layer by evaporation, spin coating or sputtering, and then patterns of the first insulating portion 07, the second insulating portion 08, and the etch barrier layer 09 are formed by a patterning process.

Then, as shown in FIG. 5e, patterns of a first electrode 05 and a second electrode 06 electrically connected to the active layer 04 are formed on the first insulating portion 07 and the second insulating portion 08. Specifically, upon implementation, the first electrode layer and the second electrode layer may be formed on the etch barrier layer by evaporation, spin coating or sputtering, and then patterns of the first electrode and the second electrode are formed by a patterning process.

Finally, as shown in FIG. 5f, a passivation layer 10 is formed on the first electrode 05 and the second electrode 06. Specifically, upon implementation, the passivation layer may be formed by evaporation, sputtering, or spin coating, which is not limited herein.

In an alternative embodiment, the first insulating portion and/or the second insulating portion may also be located between the gate insulating layer and the active layer. The manufacturing method of such a thin film transistor is similar to that described in the foregoing embodiment, which will not be described in detail herein.

Further, taking a thin film transistor in which the active layer includes a first groove and a second groove, and the first insulating portion is filled in the first groove and the second insulating portion is filled in the second groove as an example, the manufacturing method according to an embodiment of the present disclosure may comprise the following steps.

First, as shown in FIG. 5a, a pattern of a gate 02 is formed on a base substrate 01. Specifically, upon implementation, a gate layer may be formed on the base substrate by thermal evaporation or sputtering, and then a pattern of the gate is formed by a patterning process.

Next, as shown in FIG. 5b, a gate insulating layer 03 is formed on the gate 02. Specifically, upon implementation, the gate insulating layer may be formed by evaporation, sputtering or spin coating, which is not limited herein.

Figure 6A:
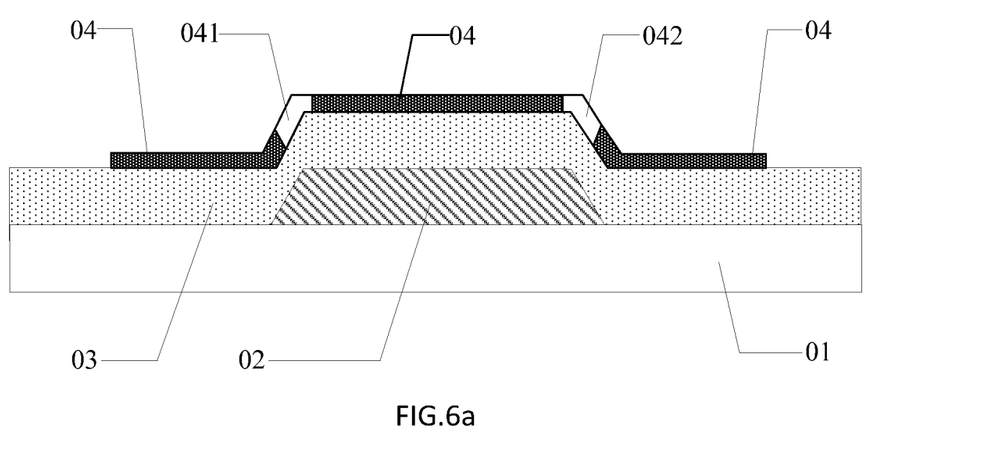
FIGS. 6a to 6d are schematic structural views after each step of a manufacturing method of a thin film transistor as provided by another embodiment of the present disclosure is performed, respectively.

Then, as shown in FIG. 6a, a pattern of an active layer 04 including a first groove 041 and a second groove 042 is formed on the gate insulating layer 03. Specifically, upon implementation, an active material layer may be formed on the gate insulating layer by spin coating, and then a pattern of the active layer including the first groove 041 and the second groove 042 is formed by a patterning process.

Figure 6B:
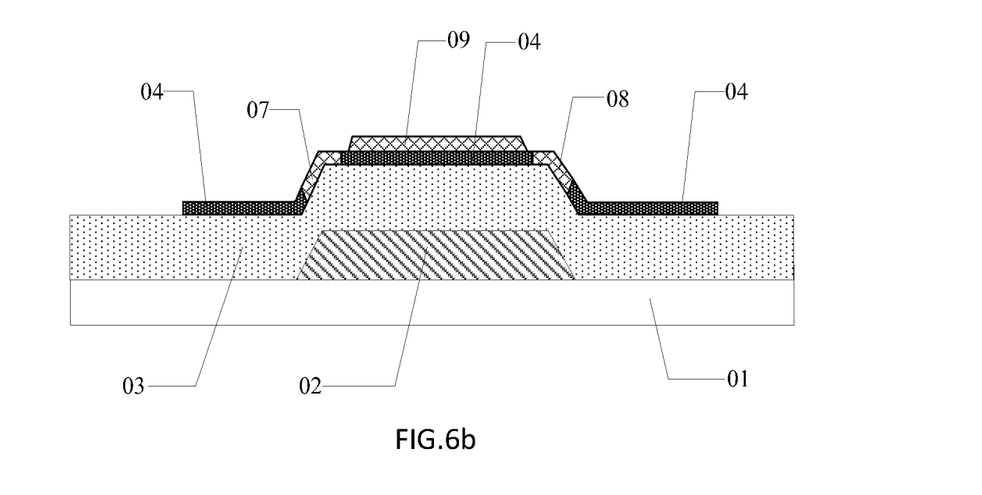

Next, as shown in FIG. 6b, a first insulating portion 07 and a second insulating portion 08 filling the first groove and the second groove are formed, and a pattern of an etch barrier layer 09 is formed on the active layer 04. Specifically, upon implementation, an insulating material layer filling the first groove and the second groove and covering the active layer may be formed on the active layer by evaporation, spin coating or sputtering, and then patterns of the first insulating portion, the second insulating portion, and the etch barrier layer are formed by a patterning process.

Figure 6C:
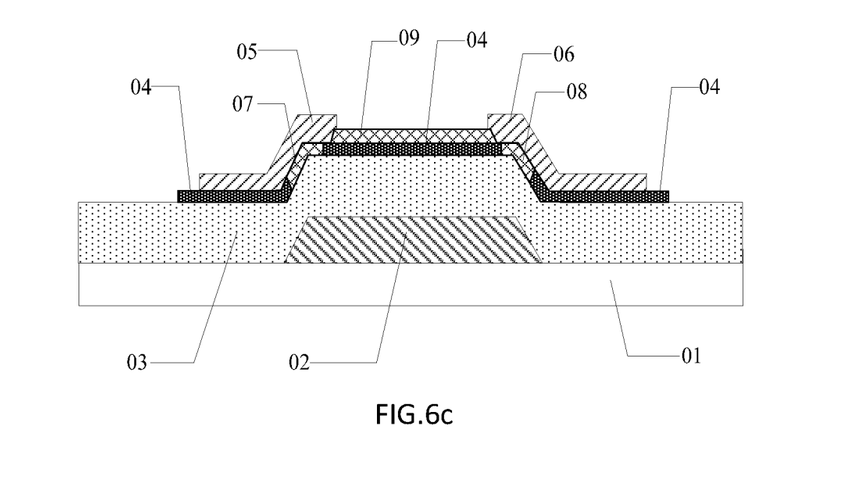

Then, as shown in FIG. 6c, patterns of a first electrode 05 and a second electrode 06 electrically connected to the active layer 04 are formed on the first insulating portion 07 and the second insulating portion 08. Specifically, upon implementation, a first electrode layer and a second electrode layer may be formed on the first insulating portion and the second insulating portion by evaporation, spin coating or sputtering, and then patterns of the first electrode and the second electrode are formed by a patterning process.

Figure 6D:
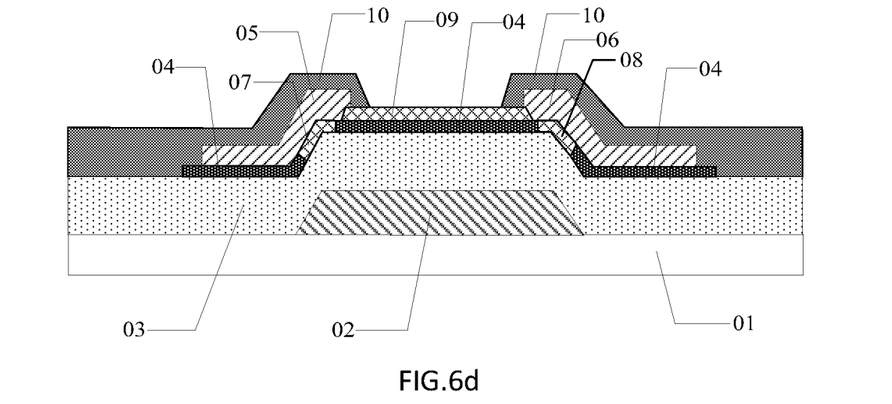

Finally, as shown in FIG. 6d, a passivation layer 10 is formed on the first electrode 05 and the second electrode 06. Specifically, upon implementation, the passivation layer may be formed by evaporation, sputtering or spin coating, which is not limited herein.

An embodiment of the present disclosure further provides an array substrate comprising the above-described thin film transistor provided by an embodiment of the present disclosure. Other components essential to the array substrate will be appreciated by those ordinarily skilled in the art, which are not described herein for brevity and should not be construed as limiting the present disclosure. For the implementation of the array substrate, reference may be made to the foregoing embodiments of the thin film transistor, and repetitions are not described herein again.

Figure 7:
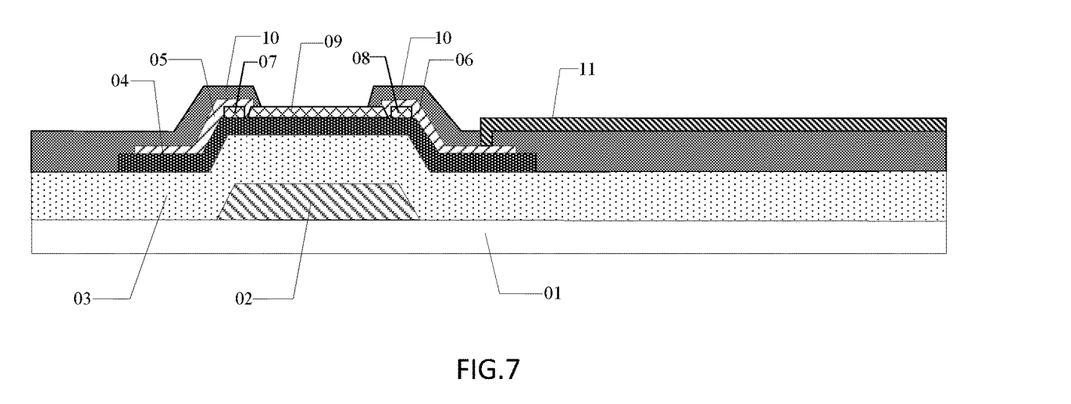
FIG. 7 is a schematic sectional structural view of an array substrate provided by an embodiment of the present disclosure.

In an exemplary embodiment, the above-described array substrate provided by an embodiment of the present disclosure may further comprise, as shown in FIG. 7, a pixel electrode 11 on the passivation layer 10, which is electrically connected to the second electrode 06 of the thin film transistor via a through hole penetrating the passivation layer 10.

The above-described array substrate provided by an embodiment of the present disclosure may be applied to a liquid crystal display (LCD) panel, and may also be applied to an organic light emitting diode (OLED) display panel, which is not limited herein.

An embodiment of the present disclosure further provides a display device comprising the above-described array substrate provided by an embodiment of the present disclosure. The display device may be any product or component having a display function such as a display panel, a mobile phone, a tablet computer, a television, a display, a notebook computer, a digital photo frame, a navigator, and the like. For the implementation of the display device, reference may be made to the foregoing embodiments of the thin film transistor, and repetitions are not described herein again.

In the thin film transistor, the manufacturing method thereof, the array substrate, and the display device provided by embodiments of the present disclosure, the first insulating portion is disposed in the first electrode, wherein the orthographic projection of the first insulating portion on the base substrate, the orthographic projection of the first electrode on the base substrate, and the orthographic projection of the boundary between the side surface of the gate and the upper surface thereof on the base substrate at least partially overlap. In a typical thin film transistor, on the one hand, electrostatic accumulation electrostatic accumulation easily occurs at the boundary between the side surface of the gate and the upper surface thereof, which causes a breakdown of the gate insulating layer, and on the other hand, the active layer is prone to breakage in a region corresponding to the boundary between the side surface of the gate and the upper surface thereof (for example, due to the large thickness of the gate 02 or the presence of impurities), so that a short circuit is likely to occur between the gate of the TFT and the first electrode at the position where electrostatic accumulation or breakage occurs. In view of this, the present disclosure proposes to arrange a first insulating portion between the gate insulating layer and the first electrode in the active layer region which is prone to breakage and the gate insulating layer region where electrostatic accumulation easily occurs. In this way, even if the gate insulating layer and the active layer are broken in a region corresponding to the boundary between the side surface of the gate and the upper surface thereof, a short circuit will not occur between the gate and the first electrode, thereby avoiding a failure in the TFT.

Obviously, those skilled in the art can make various modifications and variations to the present disclosure without departing from the spirit and scope thereof. In this way, if these modifications and variations to the present disclosure pertain to the scope of the claims of the present disclosure and equivalent technologies thereof, the present disclosure also intends to encompass these modifications and variations.

The invention claimed is:

1. A thin film transistor comprising:
    a base substrate;
    a gate on the base substrate, the gate comprising a first top surface, a first side surface, and a second side surface opposite to the first side surface;
    a gate insulating layer on the gate;
    an active layer on both the gate and the gate insulating layer, the active layer comprising a second top surface;
    a source and a drain on the active layer and electrically connected to the active layer;
    an opening exposing a part of the second top surface of the active layer;
    a first insulating portion between the gate insulating layer and the source, the first insulating portion being on the gate insulating layer, wherein an orthographic projection of the first insulating portion on the base substrate does not overlap with an orthographic projection of the part of the second top surface of the active layer exposed by the opening on the base substrate; and a second insulating portion between the gate insulating layer and the drain, wherein the opening is defined as a space between the first insulating portion and the second insulating portion, wherein the orthographic projection of the first insulating portion on the base substrate, an orthographic projection of the source on the base substrate, and an orthographic projection of a boundary between the first top surface and the first side surface of the gate on the base substrate at least partially overlap one another, wherein the source is in direct contact with a first portion of the active layer and in contact with the second top surface of the active layer through the opening, the first portion of the active layer is not exposed by the opening, and wherein the drain is in direct contact with a second portion of the active layer and in contact with the second top surface of the active layer through the opening, the second portion of the active layer is not exposed by the opening.

2. The thin film transistor according to claim 1, wherein the first insulating portion is between the source and the active layer.

3. The thin film transistor according to claim 1, wherein the second insulating portion is on the gate insulating layer, an orthographic projection of the second insulating portion on the base substrate does not overlap with the orthographic projection of the part of the second top surface of the active layer exposed by the opening on the base substrate, and wherein the orthographic projection of the second insulating portion on the base substrate, an orthographic projection of the drain on the base substrate, and an orthographic projection of a boundary between the first top surface and the second side surface of the gate on the base substrate at least partially overlap one another.

4. The thin film transistor according to claim 3, wherein the second insulating portion is between the drain and the active layer.

5. The thin film transistor according to claim 1, wherein the first insulating portion is between the active layer and the gate insulating layer.

6. The thin film transistor according to claim 3, wherein the second insulating portion is between the active layer and the gate insulating layer.

7. The thin film transistor according to claim 1, further comprising:

an etch barrier layer over the active layer and between the source and the drain.

8. The thin film transistor according to claim 7, wherein a material of the first insulating portion comprises a same material as that of the etch barrier layer.

9. The thin film transistor according to claim 1, wherein a material of the second insulating portion is a same material as that of the etch barrier layer.

10. An array substrate comprising the thin film transistor according to claim 1.

* * * * *